United States Patent
Crawford et al.

(10) Patent No.: US 8,867,232 B2
(45) Date of Patent: Oct. 21, 2014

(54) DISPLAY PANEL MOUNTING ADAPTER FOR INDUSTRIAL CONTROL SYSTEM

(71) Applicant: GE Intelligent Platforms, Inc., Charlottesville, VA (US)

(72) Inventors: Kenneth W. Crawford, Barboursville, VA (US); Vinson R. Epperson, Ruckersville, VA (US); Tommy J. Hatmaker, Jr., Charlottesville, VA (US)

(73) Assignee: GE Intelligent Platforms, Inc., Charlottesville, VA (US)

( * ) Notice: Subject to any disclaimer, the term of this patent is extended or adjusted under 35 U.S.C. 154(b) by 88 days.

(21) Appl. No.: 13/662,707

(22) Filed: Oct. 29, 2012

(65) Prior Publication Data

US 2014/0120773 A1    May 1, 2014

(51) Int. Cl.
    H05K 7/02    (2006.01)
(52) U.S. Cl.
    USPC .......................... 361/807; 361/759; 361/802
(58) Field of Classification Search
    USPC ......... 361/725, 726, 731–734, 740, 747, 759, 361/801, 802, 807, 809, 810; 439/625, 626
    See application file for complete search history.

(56) References Cited

U.S. PATENT DOCUMENTS

| | | | |
|---|---|---|---|
| 5,700,976 A | 12/1997 | Hahn et al. | |
| 5,865,403 A * | 2/1999 | Covell | 248/27.1 |
| 6,061,603 A | 5/2000 | Papadopoulos et al. | |
| 6,529,381 B1 * | 3/2003 | Schoenfish | 361/725 |
| 6,606,252 B1 * | 8/2003 | Snider | 361/777 |
| 7,247,098 B1 | 7/2007 | Bradford et al. | |
| 7,447,043 B2 * | 11/2008 | Haselby et al. | 361/801 |
| 8,154,857 B2 * | 4/2012 | Kendall et al. | 361/679.01 |
| 2002/0057209 A1 | 5/2002 | Sampsell | |
| 2002/0199047 A1 | 12/2002 | DuPont et al. | |
| 2005/0155043 A1 | 7/2005 | Schulz et al. | |
| 2009/0102679 A1 | 4/2009 | Schoettle | |
| 2009/0157200 A1 | 6/2009 | Hams | |
| 2011/0007018 A1 | 1/2011 | Mckinley et al. | |

FOREIGN PATENT DOCUMENTS

| | | |
|---|---|---|
| CN | 102122164 A | 7/2011 |
| DE | 9312000 U1 | 9/1994 |
| DE | 102008036964 A1 | 2/2010 |
| EP | 2405728 A2 | 1/2012 |

OTHER PUBLICATIONS

Search Report and Written Opinion from PCT/2013/060101 dated Dec. 20, 2013.
Yoshida, R. et al., "Exweb: Remotely Operating Devices In The Home Network", Networked Appliances, 2002. Gaithersburg. Proceedings. 2002 IEEE 4th International Workshop, Issue Date: 2002, on p. 267-274, Print ISBN: 0-7803-7259-X.

* cited by examiner

Primary Examiner — Hung S Bui
(74) Attorney, Agent, or Firm — GE Global Patent Operation; Mark A. Conklin

(57) ABSTRACT

A system for fittingly mounting a display panel onto a controller of an industrial control system is provided. The system includes a display panel adapter plate that attaches to a display panel, and a panel adapter plate that attaches to an industrial controller cabinet or door. The display panel adapter and the panel adapter plate includes complimentary tension connectors that mate to fixedly attach the display panel adapter to the panel adapter plate, thereby connecting the display panel to the controller cabinet. In at least one embodiment, the display panel adapter also includes a compute engine mount that attaches a compute engine to the display panel via the display panel adapter. In at least another embodiment, the display panel adapter also includes a tether mount that allows the display panel to interlace with a remote compute engine.

18 Claims, 6 Drawing Sheets

DISPLAY PANEL MOUNTING ADAPTER FOR INDUSTRIAL CONTROL SYSTEM

FIELD OF THE INVENTION

The present disclosure relates generally to industrial control mounting systems. More particularly, the present disclosure relates to a system and method for mounting a display panel onto a controller of an industrial control system.

BACKGROUND OF THE INVENTION

Modern industrial control systems are typically composed of an array of individual control modules that are plugged into a fixed backplane, mounted within a cabinet, and connected to input and output (I/O) modules in one or more locations around an industrial installation or manufacturing facility. As industrial processes have become more complex and the need for distributed control systems increases, local input and output (I/O) modules have been replaced with remote input/output (I/O) drops. This led to an increased need for control modules to be physically located within the plant in multiple locations near the input/output (I/O) drops.

When wiring directly to input/output (I/O) modules within a control system having a fixed backplane, users must place the control system close to the equipment/machinery being controlled in order to minimize material costs (e.g., wire and conduit), installation costs (e.g., pulling the additional wire longer distances, engineering drawings, etc), and maintenance costs (e downtime due to cable cuts/shorts from things like vibration). When expanding input/output (I/O) within an industrial application, more control systems will be needed closer to the machines, which increases installation costs due to the need for more control modules, and associated cabinets, and the like. This adds both cost and complexity because multiple control systems must be interconnected and coordinated. Thus, expansion using current control system with their fixed backplane structure can result in increased expense and inconvenience associated with the need for more rack/cabinet space, because most of the input and output (I/O) modules must be located closer to the equipment that is being monitored and controlled.

During commissioning and operation of an industrial control system, operators need to use multiple discrete devices to debug and run their process or application. Further, in order to perform status, control and maintenance operations, technician/operators also need to utilize multiple discrete tools, personnel and resources. Because industrial control systems are frequently mounted in enclosures in order to protect the equipment and provide security, repeatedly accessing the control system within the enclosure for multiple discrete took, personnel and resources is extremely inefficient.

The use of individual compute boxes mounted on the industrial control system helps to alleviate some of the access issues. However, mounting of the displays for the compute boxes, e.g., liquid crystal displays (LCDs), can be difficult. Mounting a display typically requires multiple installers in order to hold and align the display while the display is being attached by tools, usually by being screwed onto the controller and/or controller cabinet. The difficulty with mounting the displays is exacerbated when installing larger displays. This process makes it difficult to mount and/or remove the displays from the controller and significantly increases the time, cost and convenience of installing and maintaining the displays.

The above-described shortcomings significantly limit the configuration, flexibility, and accessibility of mounting displays within known industrial control systems. Therefore, there remains a need for a system and method for conveniently mounting a display onto a controller of an industrial control system. There also remains a need for a system and method of mounting a display onto an industrial controller that allows an individual installer to complete the installation.

SUMMARY OF THE INVENTION

In at least one aspect, the present disclosure provides an industrial display mount including a display panel adapter arranged and configured to connect to a display panel, and a panel adapter arranged and configured to connect to an industrial controller cabinet. The display panel adapter includes a first set of connectors disposed substantially along the perimeter of the display panel adapter, wherein the first set of connectors are arranged and configured to engage corresponding structures associated with a panel adapter plate. The display panel adapter also includes a mounting collar disposed substantially along the perimeter of the display panel adapter, wherein the mounting collar is arranged and configured to attach a compute engine to the display panel adapter. The panel adapter plate includes a second set of connectors disposed substantially along the perimeter of the panel adaptor plate, wherein the second set of connectors are arranged and configured to engage corresponding structures associated with the display panel adapter. In operation, the first set of connectors and the second set of connectors fittingly mate to attach the display panel adapter to the panel adapter plate.

In at least another aspect, the present disclosure provides an industrial display mount including a display panel adapter that connects to a display panel and panel adapter plate configured to connect to an industrial controller cabinet. The display panel adapter includes a first connector associated with the display panel adapter, wherein the connector is configured to engage a corresponding structure associated with a panel adapter plate. The display panel adapter also includes a compute engine mounting structure associated with the display panel adapter, wherein the compute engine mounting structure is configured to attach a compute engine to the display panel adapter. The panel adapter plate includes a second connector associated with the panel adapter plate, wherein the second connector is configured to engage a corresponding structure associated with the display panel adapter. In operation, the first connector and the second connector mate to attach the display panel adapter to the panel adapter plate.

In yet another aspect, the present disclosure provides an industrial display mount including a display panel adapter that connects to a display panel, and a panel adapter plate that connects to a controller cabinet. The display panel adapter includes a first connector associated with the display panel adapter, wherein the connector is configured to engage a corresponding structure associated with a controller cabinet. The display panel adapter also includes a tether adapter associated with the display panel adapter, wherein the tether adapter is configured to interface with a remote computer. The panel adapter plate includes a second connector associated with the panel adapter plate, wherein the second connector is configured to engage a corresponding structure associated with the display panel adapter. In operation, the first connector and the second connector mate to attach the display panel adapter to the panel adapter plate such that the display panel interfaces with a remote compute engine.

Figure 1:
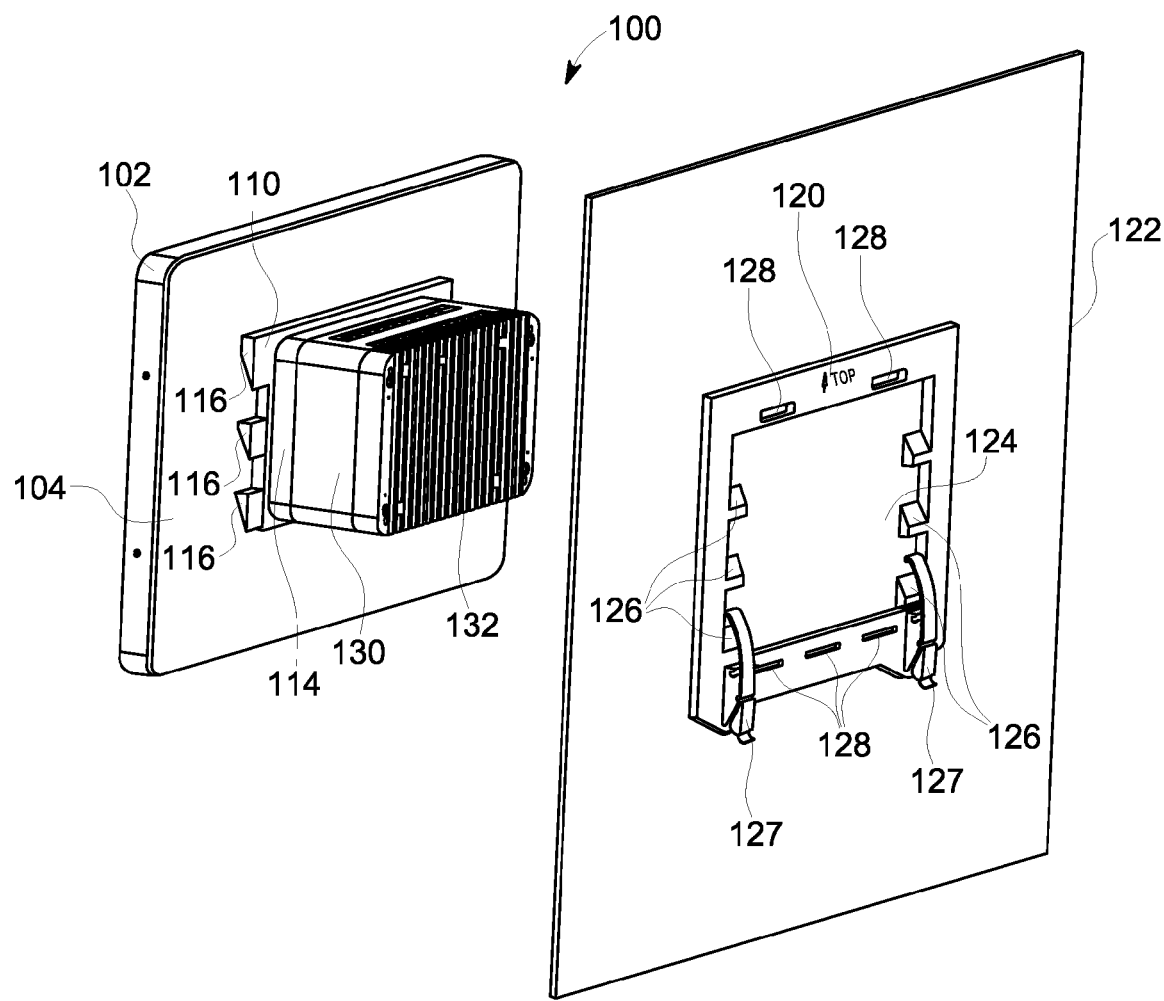
FIG. 1 illustrates a perspective view of a display mounting adapter including the display adapter plate and the mounting panel in accordance with at least one embodiment of the present disclosure.

The present disclosure may take form in various components and arrangements of components, and in various process operations and arrangements of process operations. The present disclosure is illustrated in the accompanying drawings, throughout which, like reference numerals may indicate corresponding or similar parts in the various figures. The drawings are only for purposes of illustrating preferred embodiments and are not to be construed as limiting the disclosure. Given the following enabling description of the drawings, the novel aspects of the present disclosure should become evident to a person of ordinary skill in the art.

DETAILED DESCRIPTION OF THE DRAWINGS

The following detailed description is merely exemplary in nature and is not intended to limit the applications and uses disclosed herein. Further, there is no intention to be bound by any theory presented in the preceding background or summary or the following detailed description. While embodiments of the present technology are described herein primarily in connection with industrial controllers, the concepts are also applicable to other types of mounted display controllers.

In at least one aspect, the present disclosure provides a system and method for conveniently and securely mounting a display (panel or display panel), e.g., a liquid crystal display (LCD) touchscreen, onto an industrial controller by attaching the display panel to a mounting panel or cabinet of the industrial controller via a display mounting adapter. In at least one aspect, the present disclosure provides a display mounting adapter including a display panel adapter and an adapter plate. The display panel adapter attaches to the rear of a display panel and the adapter plate attaches to a mounting panel or cabinet of an industrial controller. The display panel adapter and the adapter plate both include structures that mate each other to securely affix the display panel to the industrial controller. In one aspect, the panel adapter plate also includes a collar that mounts a compute engine, e.g., an industrial PC (IPC), to the display panel. In another aspect, the panel adapter plate includes a tether lid that connects the display panel to a remote industrial controller.

Figure 2:
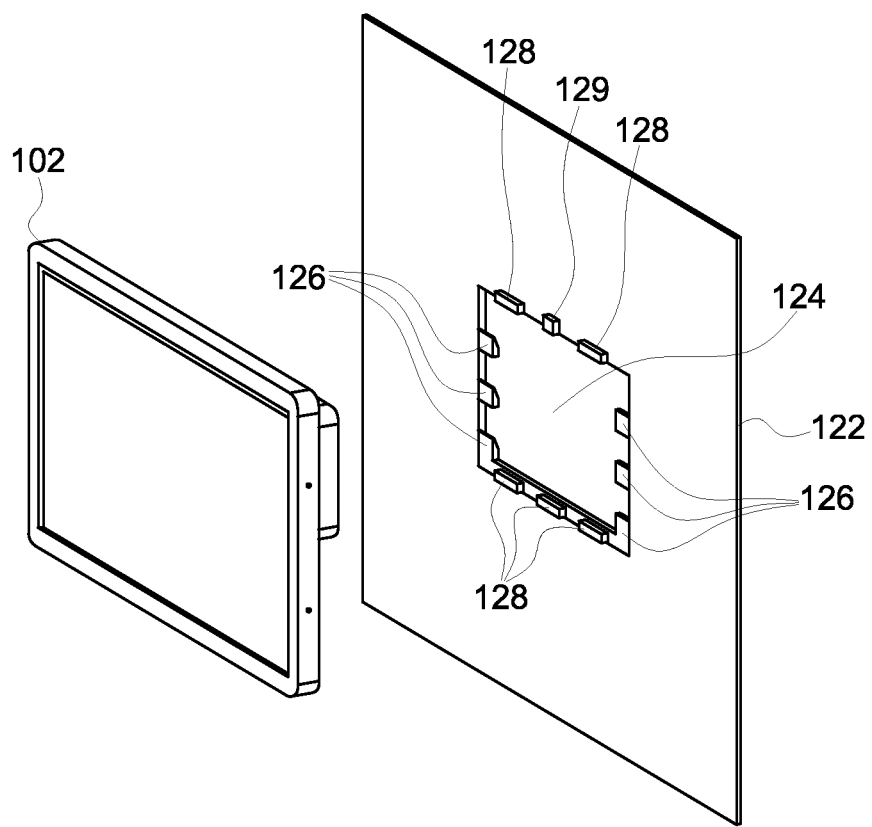
FIG. 2 illustrates a perspective view of the display adapter plate in accordance with at least one embodiment of the present disclosure.
Figure 3:
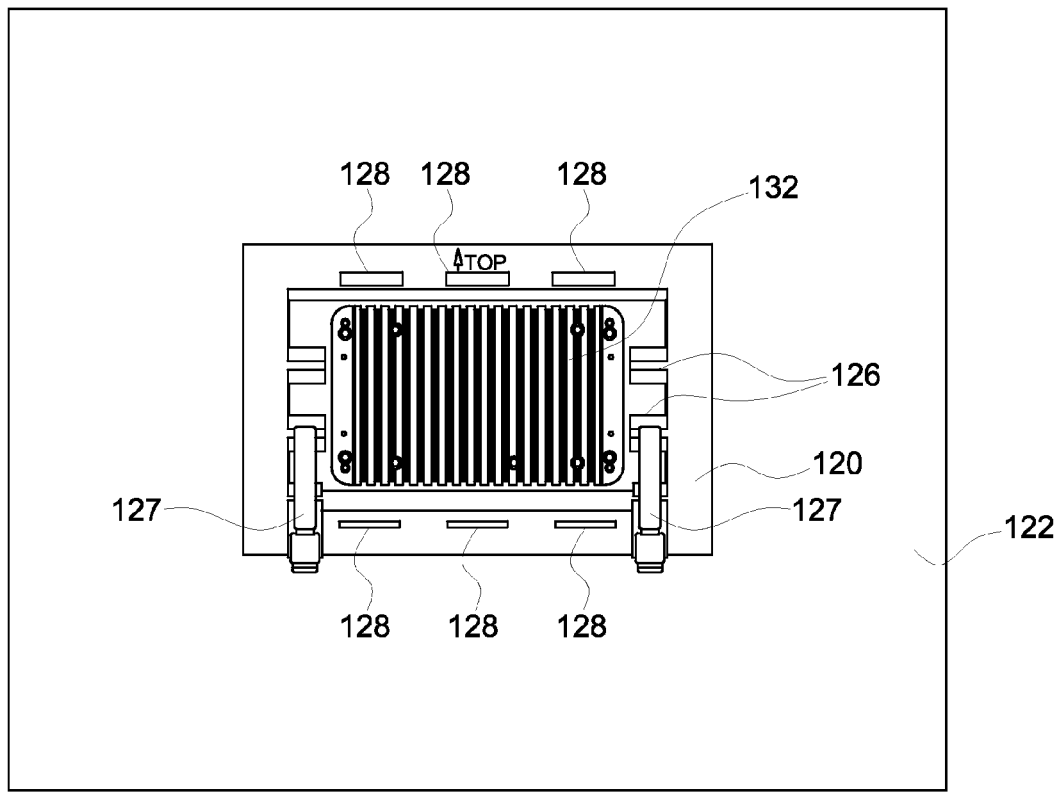
FIG. 3 illustrates a view of the rear of the display mounting adapter in accordance with at least one embodiment of the present disclosure, when assembled.

FIGS. 1-3 illustrate a display mounting adapter in accordance with an embodiment of the present disclosure. FIG. 1 illustrates a rear perspective view of the components of the display mounting adapter in accordance with the present disclosure. FIG. 2 illustrates a front perspective view of the components of the display mounting adapter in accordance with an embodiment of the present disclosure. FIG. 3 illustrates a rear view of the components of the display mounting adapter in accordance with the present disclosure. The various views are relied upon in describing the components of the present disclosure.

The display mounting adapter 100 includes a display panel adapter 110 and a panel adapter plate 120. The display mounting adapter 100 may be formed of a resilient and stable material, e.g., aluminum, that provides both durability and longevity. The display panel adapter 110 connects to the rear of a display panel 102 and serves to interface and convert the electrical signals to/from the display panel 102 to/from the IPC 130 (or controller, not shown here). In some embodiments, the IPC 130 may be a compute engine, compute box, or the like. In some embodiments, the display panel 102 may be a user interface (IU), human machine interface (HMI), operator interface (OI), or the like. In some embodiments, the IPC 130 may include an associated cooler 132, e.g., a passive cooler (heat sink) or fan. The display panel adapter 110 also serves as a mechanical interposer between the enclosure of the display panel 102 and the IPC 130 (or controller). The display panel adapter 110 may be connected to the display panel 102, for example, with standard screw connectors. The panel adapter plate 120 connects to a cutout 124 in a mounting panel or controller cabinet 122. The physical interface between the display panel 102 and the mounted panel adapter 122 (or controller cabinet) is maintained by a gasket material 104, e.g., rubber, silicone, polytetrafluoroethylene (PTFE), plastic polymers, and the like, that forms a water tight and dust tight seal between the two components. The gasket material 104 may be integrated into the rear enclosure of the display panel 102 or be added during installation. The gasket material 104 may be placed in various configurations including, for example, along a perimeter of the rear of the display panel 102 or over a large surface area of the rear of the display panel 102.

The display panel adapter 110 includes a plurality of tension connectors 116, e.g., wedge-shaped connectors, along the perimeter. The tension connectors 116 are designed and arranged to engage complimentary structures 126 associated with the panel adapter plate 120. While particular embodiments disclosed herein may include wedge-shaped connectors 116, other connectors are envisioned and may be used without departing from the present disclosure including, for example, angled blades, curved fins, and the like. A mounting collar 114 is also disposed along a perimeter of the display panel adapter 110. The mounting collar 114 is designed and arranged to connect an industrial PC (IPC) 130 or compute engine to the display panel adapter 110. The display panel adapter 110 may include an opening or void that permits the IPC 130 to access an interface of the display panel 102.

The panel adapter plate 120 is configured and arranged to mount a wide range of display panel sizes, e.g., less than 12 inch to more than 30 inch screens. As shown in FIG. 2, the panel adapter plate 120 includes a set of panel connection structures 128, e.g., feet or notches, that secure the panel adapter plate 120 to a cutout 124 in the controller cabinet 122. In one embodiment, a plurality of feet are used. The panel adapter plate 120 also includes a plurality of tension connectors 126, e.g., wedge-shaped connectors, along the perimeter. The tension connectors 126 are designed and arranged to engage complimentary structures associated with the display panel adapter 110. While particular embodiments disclosed herein may include wedge-shaped connectors 126, other connectors are envisioned and may be used without departing from the present disclosure including, for example, angled blades, curved fins, and the like. The panel adapter plate 120 may also include a polarization element 129, e.g., a directional notch, that ensures that the panel adapter plate 120 is mounted in the proper orientation, e.g., up or down. The tension connectors 116 of the display panel adapter 110 and the tension connectors 126 of the panel adapter plate 120 mate to fittingly secure the display panel 102 (and attached IPC 130) to the controller cabinet. Further, the display panel adapter 110 and the panel adapter plate 120 allow an individual technician or installer to conveniently mount and secure the display 102 to the controller cabinet without the use of or need for tools or other connectors.

In use, the display panel adapter 110 and the panel adapter plate 120 are connected to each other by aligning the display panel adapter 110 with the panel adapter plate 120, and pressing down on the display panel adapter 110 until the tension connectors 116, 126 fittingly mate each other such that the display panel adapter 110 is detent. Connection mechanisms 127, e.g., latches, engage the tops of the tension connectors 116 to securely lock, the display panel adapter 110 and the attached display panel 102 in the pan ell adapter plate 120. While particular embodiments of the connection mechanisms 127 disclosed herein may include a latch, other connection mechanisms, e.g., locking cam levers, screw connectors, and the like, are envisioned and may be used without departing from the present disclosure.

Figure 4:
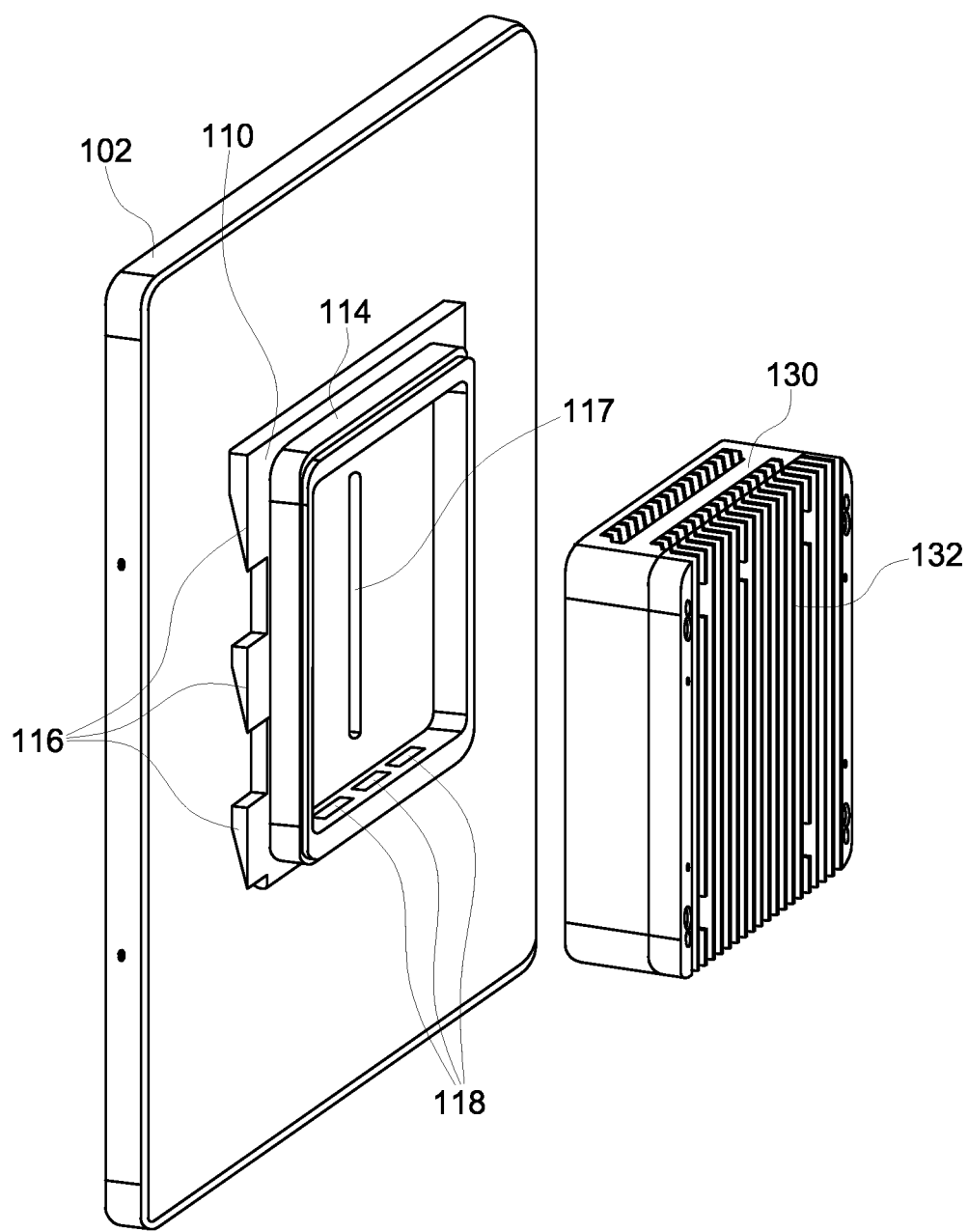
FIG. 4 illustrates another view of the adapter plate in accordance with an embodiment of the present disclosure.

FIG. 4 illustrates another view of the adapter plate in accordance with an embodiment of the present disclosure. As shown in FIG. 4, the adapter plate 110 is connected to the rear of display panel 102. The display panel adapter 110 includes a mounting collar 114 and tension connectors 116 both being disposed substantially along the perimeter. The interior portion of the display panel adapter 110 includes an opening or void to permit access to the display panel interface 117 and output/control slots 118 via, for example, IPC 130 including passive cooler 132. The IPC 130 includes a controller interface (not shown here), e.g., an Rxi IPC interface, that connects to the display panel interface 117. In at least some embodiments, the controller interface provides the display panel 102 with a variety of signals for utilities, functions and controls including, e.g., printed wiring assembly (PWA) power, low voltage differential signaling (LVDS), backlight, backlight control, I2C, USB, SATA, digital audio, SD and mPCIe status signals. These signals are presented to PWA through a riser card extender in the IPC 130. The display interface 117 provides a single connector interface providing for display power, LVDS data signals and clock signals, backlight power and control, touchscreen interface, LED status and FPIO. The display panel adapter 110 may also include an external power connector 118, e.g., a modular 3-pin connector, to provide the direct current (DC) voltage to power the display panel 102.

Figure 5:
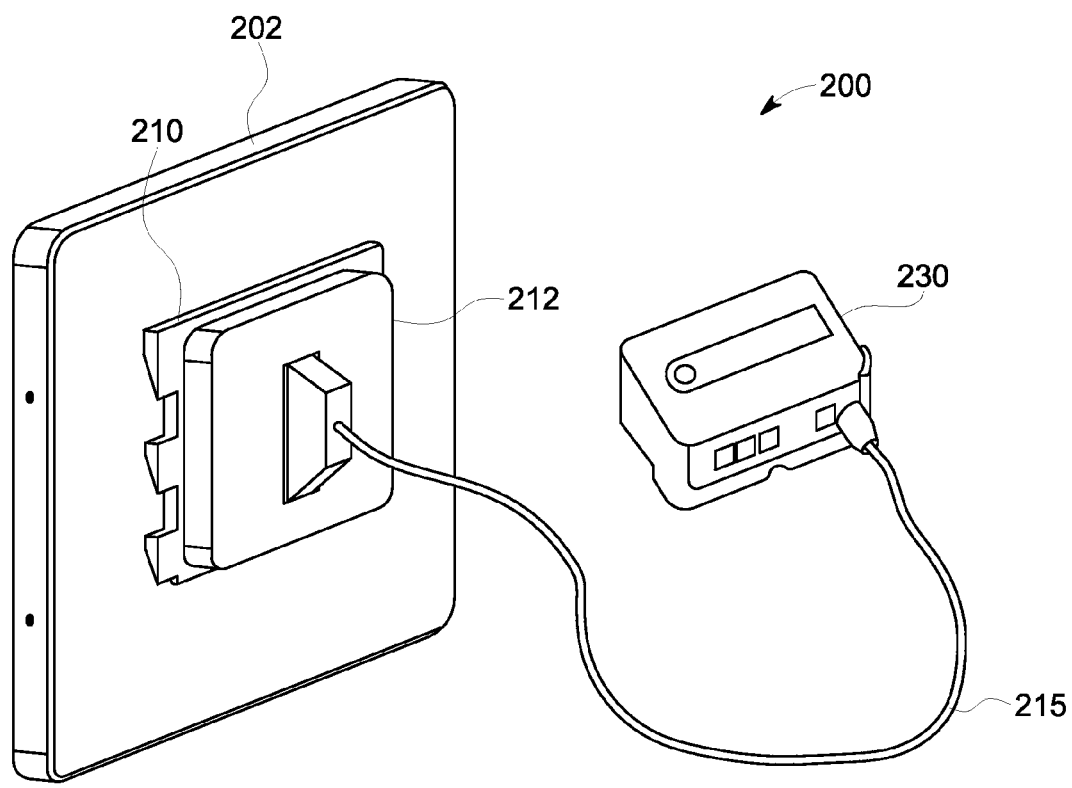
FIG. 5 illustrates an overview of a remote tethered controller arrangement in accordance with another alternative embodiment of the present disclosure.
Figure 6:
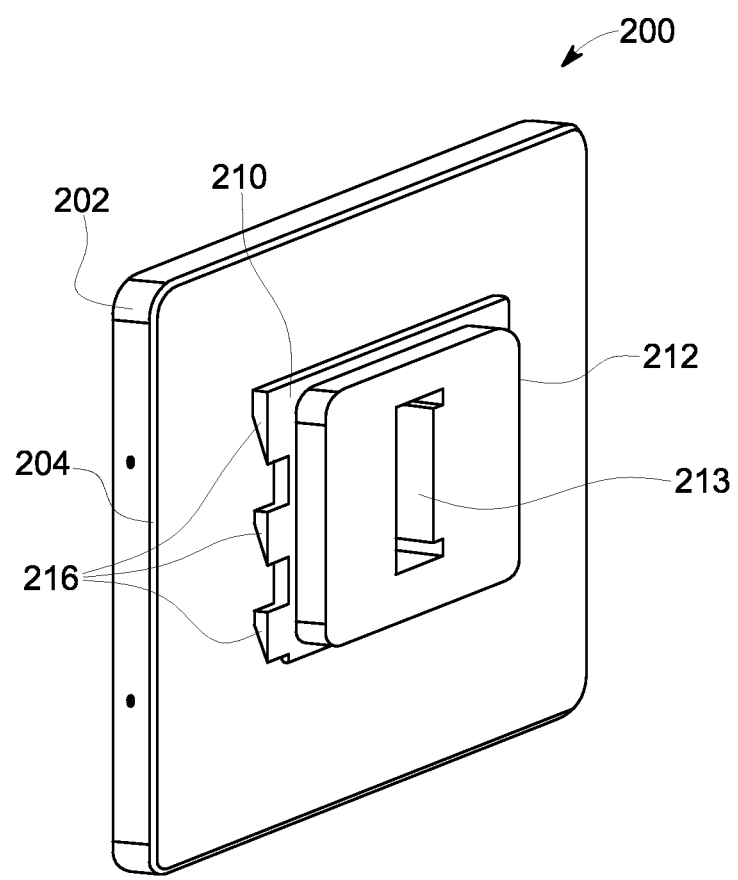
FIG. 6 illustrates a perspective view of a remote tethered controller arrangement in accordance with an alternative embodiment of the present disclosure.

FIGS. 5 and 6 illustrate views of a remote tethered controller arrangement in accordance with an alternative embodiment of the present disclosure. FIG. 5 provides an overview of a remote tethered controller arrangement 200. FIG. 6 provides a perspective view of the rear of the display panel adapter 210 for the remote tethered controller arrangement 200. In at least one embodiment, the present disclosure provides a display panel adapter 210 including a tether adapter 212 having a tether interface 213. The display panel adapter 210 includes similar components as display panel adapter 110, discussed above with respect to FIGS. 1-4, including tension connectors 216. However, in this embodiment, the display panel adapter 210 does not directly connect to an IPC. Instead, the display panel adapter 210, as shown in FIG. 5, connects to a remotely tethered IPC 230 via tether interface 213 and cable 215. The display panel adapter 210 allows the display panel 202 to be tethered to and in communication with an IPC 230 placed a distance away from the display panel 202. The tether interface 213 enables communication with a display panel interface (not shown) and provides control signals to/from the electronics of the display panel 202 and the remotely tethered IPC 230. The display adapter 210 connects to a controller cabinet (not shown) via tension connectors 216 in the same manner as discussed above with respect to connectors 116 in FIGS. 1-4. The tension connectors 216 of the display panel adapter 210 fittingly mate to corresponding tension connectors (not shown) of a panel adapter plate (not shown) to secure the display panel 202 to the controller cabinet and allows the display panel 202 to be connected to remote IPC 230. Further, the display panel adapter 210 and the panel adapter plate allow an individual technician or installer to conveniently mount and secure the display 202 to the controller cabinet without the use of or need for tools or other connectors.

A gasket material 204 may also be included to form a physical interface between the display panel 202 and the mounted panel adapter or controller cabinet (not shown). The gasket material 204 should form a watertight and dust tight seal between the display panel 202 and the panel adapter/controller cabinet. The gasket material 204 may be formed of a material, e.g. rubber, silicone, polytetrafluoroethylene (PTFE), plastic polymers, and the like, that forms a water tight and dust tight seal between the two components. The gasket material 204 may be integrated into the rear enclosure of the display panel 202 or be added during installation. The gasket material 204 may be placed in various configurations including, for example, along a perimeter of the rear of the display panel 202 or over a large surface area of the rear of the display panel 202. An adhesive, e.g., epoxy, polyurethane, and the like may also be used to assist with securing the display panel 202 and with forming a watertight and dust tight seal.

Alternative embodiments, examples, and modifications which would still be encompassed by the disclosure may be made by those skilled in the art, particularly in light of the foregoing teachings. Further, it should be understood that the terminology used to describe the disclosure is intended to be in the nature of words of description rather than of limitation.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

We claim:

1. An industrial display mount comprising:
a display panel adapter arranged and configured to connect to a display panel, the display panel adapter comprising:
  a first set of connectors disposed substantially along, a perimeter of the display panel adapter, wherein the first set of connectors are arranged and configured to engage corresponding structures associated with a panel adapter plate; and
  a mounting collar disposed substantially along the perimeter of the display panel adapter, wherein the mounting collar is arranged and configured to attach a compute engine to the display panel adapter;
the panel adapter plate arranged and configured to connect to an industrial controller cabinet, the panel adapter plate comprising:
a set of feet that attach the panel adapter plate to a cutout in the industrial controller cabinet,
a second set of connectors disposed substantially along a perimeter of the panel adapter plate, wherein the second set of connectors are arranged and configured to engage corresponding structures associated with the display panel adapter, wherein the first set of connectors and the second set of connectors fittingly mate to attach the display panel adapter to the panel adapter plate.

2. The industrial display mount according to claim 1, wherein the display panel adapter slides into and locks within the panel adapter plate to fittingly attach the display panel to the industrial controller cabinet.

3. The industrial display mount according to claim 1, further comprising a connection mechanism that engages the first set of connectors to lock the display panel adapter to the panel adapter plate.

4. The industrial display mount according, to claim 1, wherein the panel adapter plate further comprises a polarization element that assists with mounting the panel adapter plate in the proper orientation.

5. The industrial display mount according to claim 1, wherein the display panel adapter includes a void in the center that allows a compute engine interface to connect to an interface of the display panel.

6. The industrial display mount according to claim 1, wherein the display panel adapter further comprises a tether adapter having, a tether interface that allows the display panel to be connected to a remote compute engine.

7. The industrial display mount according to claim 1, wherein the first set of connectors and the second set of connectors are configured and arranged to form complimentary tension connectors.

8. The industrial display mount according to claim 7, wherein the complimentary tension connectors are wedge-shaped tension connectors.

9. An industrial display mount comprising:
a display panel adapter that connects to a display panel, the display panel adapter comprising:
a first connector associated with the display panel adapter, wherein the connector is configured to engage a corresponding structure associated with a panel adapter plate; and
a compute engine mounting structure associated with the display panel adapter, wherein the compute engine mounting structure is configured to attach a compute engine to the display panel adapter;
the panel adapter plate configured to connect to an industrial controller cabinet, the panel adapter plate comprising:
a panel connection structure that attaches the panel adapter plate to the industrial controller cabinet,
a second connector associated with the panel adapter plate, wherein the second connector is configured to engage a corresponding structure associated with the display panel adapter,
wherein the first connector and the second connector mate to attach the display panel adapter to the panel adapter plate.

10. The industrial display mount according to claim 9, wherein the display panel adapter slides into the panel adapter plate to fittingly attach the display panel to the industrial controller cabinet.

11. The industrial display mount according to claim 9, further comprising a connection mechanism that engages the first connector to lock the display panel adapter to the panel adapter plate.

12. The industrial display mount according to claim 9, wherein the panel adapter plate further comprises a polarization element that assists with mounting the panel adapter plate in the proper orientation.

13. The industrial display mount according to claim 9, wherein the display panel adapter includes a void that allows a compute engine interface to connect to an interface of the display panel.

14. The industrial display mount according to claim 9, wherein the display panel adapter further comprises a tether adapter that allows the display panel to interface with a remote compute engine.

15. The industrial display mount according to claim 9, wherein the first connector and the second connector are configured to form complimentary tension connectors.

16. The industrial display mount according to claim 15, wherein the complimentary tension connectors form sets of wedge-shaped tension connectors.

17. An industrial display mount comprising:
a display panel adapter that connects to a display panel, the display panel adapter comprising:
a first connector associated with the display panel adapter, wherein the connector is configured to engage a corresponding structure associated with a controller cabinet; and
a tether adapter associated with the display panel adapter, wherein the tether adapter is configured to interface with a remote computer;
a panel adapter plate configured to connect to a controller cabinet, the panel adapter plate comprising:
a second connector associated with the panel adapter plate, wherein the second connector is configured to engage a corresponding structure associated with the display panel adapter,
wherein the first connector and the second connector mate to attach the display panel adapter to the panel adapter plate such that the display panel interfaces with a remote compute engine.

18. The industrial display mount according to claim 17, further comprising a connection mechanism that engages the first connector to lock the display panel adapter to the panel adapter plate.

* * * * *

UNITED STATES PATENT AND TRADEMARK OFFICE
CERTIFICATE OF CORRECTION

PATENT NO.         : 8,867,232 B2
APPLICATION NO.    : 13/662707
DATED              : October 21, 2014
INVENTOR(S)        : Crawford et al.

It is certified that error appears in the above-identified patent and that said Letters Patent is hereby corrected as shown below:

In the Specification

In Column 1, Line 29, delete "etc)," and insert -- etc.), --, therefor.

In Column 1, Line 30, delete "(e" and insert -- (e.g., --, therefor.

In Column 1, Line 52, delete "took," and insert -- tools, --, therefor.

In Column 2, Lines 22-23, delete "adaptor" and insert -- adapter --, therefor.

In Column 5, Line 12, delete "lock," and insert -- lock --, therefor.

In Column 5, Line 13, delete "pan ell" and insert -- panel --, therefor.

In the Claims

In Column 6, Line 49, in Claim 1, delete "along," and insert -- along --, therefor.

In Column 7, Line 12, in Claim 4, delete "according," and insert -- according --, therefor.

In Column 7, Line 22, in Claim 6, delete "having," and insert -- having --, therefor.

Signed and Sealed this
Twenty-third Day of June, 2015

Michelle K. Lee
*Director of the United States Patent and Trademark Office*